United States Patent
Koga et al.

(10) Patent No.: US 10,795,265 B2
(45) Date of Patent: Oct. 6, 2020

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventors: Norihisa Koga, Koshi (JP); Yoshitaka Konishi, Sapporo (JP); Naruaki Iida, Koshi (JP); Yuzo Ohishi, Koshi (JP); Kazuhiro Takeshita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/521,052

(22) Filed: Jul. 24, 2019

(65) Prior Publication Data
US 2020/0041913 A1 Feb. 6, 2020

(30) Foreign Application Priority Data
Jul. 31, 2018 (JP) .................. 2018-144319

(51) Int. Cl.
G03B 27/42 (2006.01)
G03F 7/20 (2006.01)
G03F 7/40 (2006.01)

(52) U.S. Cl.
CPC .............. *G03F 7/704* (2013.01); *G03F 7/40* (2013.01); *G03F 7/7055* (2013.01); *G03F 7/7075* (2013.01); *G03F 7/70466* (2013.01); *G03F 7/70558* (2013.01); *G03F 7/70725* (2013.01)

(58) Field of Classification Search
CPC .. G03F 7/70466; G03F 7/7055; G03F 7/3075; G03F 7/70383; G03F 7/704; G03F 7/70358; G03F 7/70366; G03F 7/70425; G03F 7/70475; G03F 7/70558; G03F 7/70691; G03F 7/707; G03F 7/70716; G03F 7/70725; G03F 7/70733; G03F 7/7075; G03F 7/70758; G03F 7/7005; G03F 7/40; H01L 21/0274
USPC .......... 355/30, 52–55, 67–74, 77; 250/492.1, 250/492.2, 493.1, 494.1, 503.1, 505.1; 430/331
See application file for complete search history.

(56) References Cited

U.S. PATENT DOCUMENTS

| | | | | |
|---|---|---|---|---|
| 6,512,535 B1 * | 1/2003 | Nagasaka | ............... | B41J 2/442 347/240 |
| 2008/0094460 A1 * | 4/2008 | Nakata | ................... | B41J 11/002 347/102 |
| 2009/0174873 A1 * | 7/2009 | Kikuchi | .............. | G03F 7/70425 355/53 |

(Continued)

FOREIGN PATENT DOCUMENTS

JP  2001-127037 A  5/2001

*Primary Examiner* — Christina A Riddle
(74) *Attorney, Agent, or Firm* — Nath, Goldberg & Meyer; Jerald L. Meyer

(57) ABSTRACT

There is provided a substrate processing apparatus including: a light radiator configured to radiate a light for processing into an irradiation area which is smaller than a processing target area of a surface of a substrate; a driver configured to move the irradiation area in two directions that cross each other in a plane along the surface of the substrate; and a controller configured to control the driver to move an irradiation position in two directions according to a movement pattern which has been set to radiate the light to an entire area of the processing target area.

11 Claims, 16 Drawing Sheets

(56) References Cited

U.S. PATENT DOCUMENTS

| | | | | |
|---|---|---|---|---|
| 2010/0028558 | A1* | 2/2010 | Ozawa | G11B 7/266 |
| | | | | 427/558 |
| 2016/0327869 | A1* | 11/2016 | Nagahara | G03F 7/70558 |
| 2019/0025704 | A1* | 1/2019 | Iseki | G03F 7/40 |
| 2019/0361351 | A1* | 11/2019 | Koga | G03F 7/2002 |

* cited by examiner

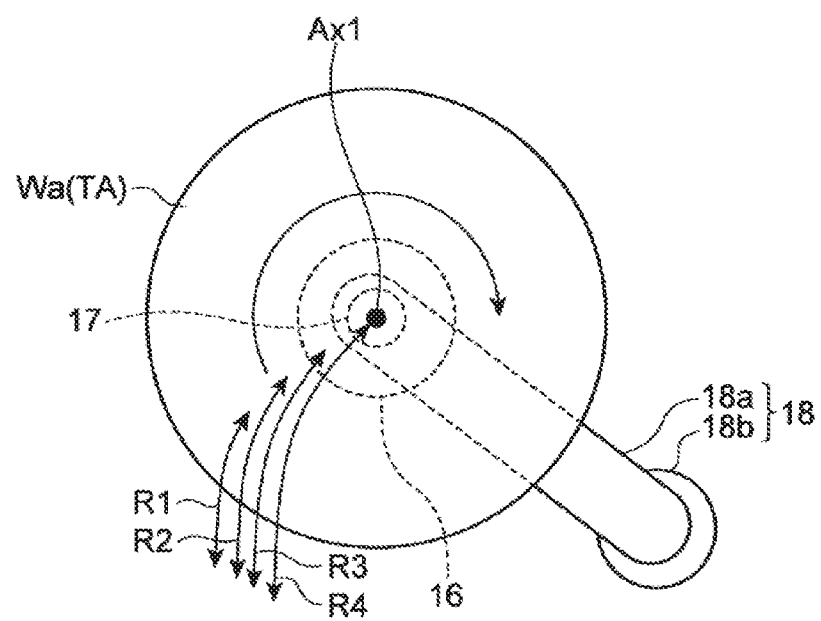

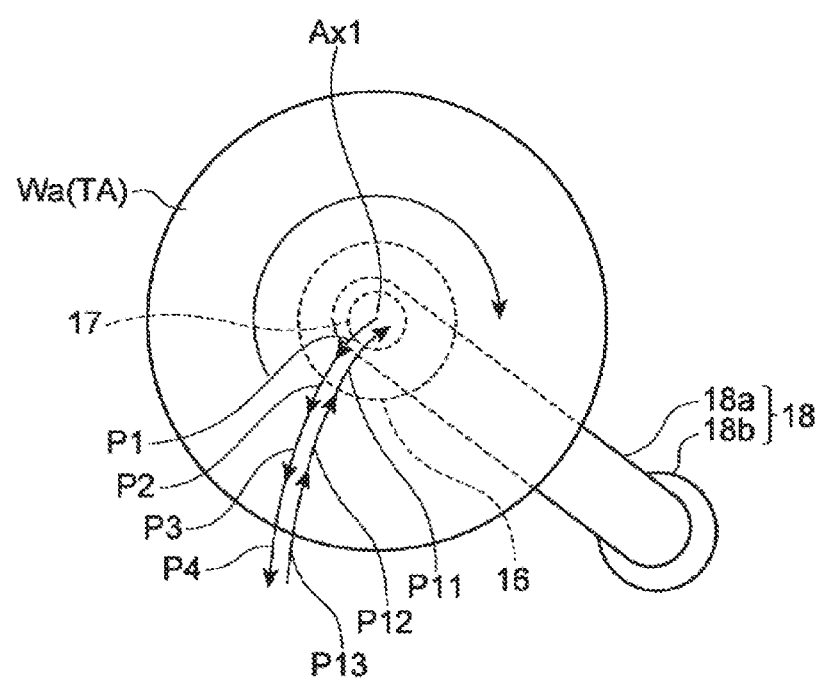

mentsof the present disclosure, and together with the general description given above and the detailed description of the embodiments given below, serve to explain the principles of the present disclosure.

SUBSTRATE PROCESSING APPARATUS, SUBSTRATE PROCESSING METHOD, AND STORAGE MEDIUM

CROSS-REFERENCE TO RELATED APPLICATION

This application is based upon and claims the benefit of priority from Japanese Patent Application No. 2018-144319, filed on Jul. 31, 2018, the entire contents of which are incorporated herein by reference.

TECHNICAL FIELD

Exemplary embodiments of the present disclosure relate to a substrate processing apparatus, a substrate processing method, and a storage medium.

BACKGROUND

Patent Document 1 discloses a method of forming a fine pattern in a manufacturing process of a semiconductor device. This method includes forming a resist film on a surface of a substrate, exposing the resist film, patterning the resist film, radiating a light on a surface of the resist pattern, and performing etching on the surface of the substrate using the resist pattern as a mask. The wavelength of the radiated light is 200 nm or less. By irradiating the resist pattern with the light having the wavelength of 200 nm or less, the roughness evenness) on the surface of the resist pattern is improved (reduced).

PRIOR ART DOCUMENT

Patent Document

Japanese Patent Laid-Open Publication No. 2001-127037

SUMMARY

The present disclosure provides a substrate processing apparatus that is effective in improving an uniformity of the irradiation amount of a light on a surface of a substrate in substrate processing in which the surface of the substrate is irradiated with a light for processing.

According to an embodiment of the present disclosure, a substrate processing apparatus includes: a light radiator configured to radiate a light for processing into an irradiation area which is smaller than a processing target area of a surface of a substrate; a driver configured to move the irradiation area in two directions that cross each other in a plane along the surface of the substrate; and a controller configured to control the driver to move an irradiation position in two directions according to a movement pattern which has been set to radiate the light to an entire area of the processing target area.

According to another embodiment of the present disclosure, a substrate processing method includes: radiating a light for processing into an irradiation area which is smaller than a processing target area of a surface of a substrate; and moving an irradiation position in two directions that cross each other according to a movement pattern which has been set to radiate the light to an entire area of the processing target area.

BRIEF DESCRIPTION OF DRAWINGS

The accompanying drawings, which are incorporated in and constitute a part of the specification, illustrate embodi

FIG. 11 is a schematic view exemplifying an operation of a scan driver during radiation.

FIG. 14 is a schematic view illustrating a modification of an operation of the scan driver.

DETAILED DESCRIPTION

Figure 1:
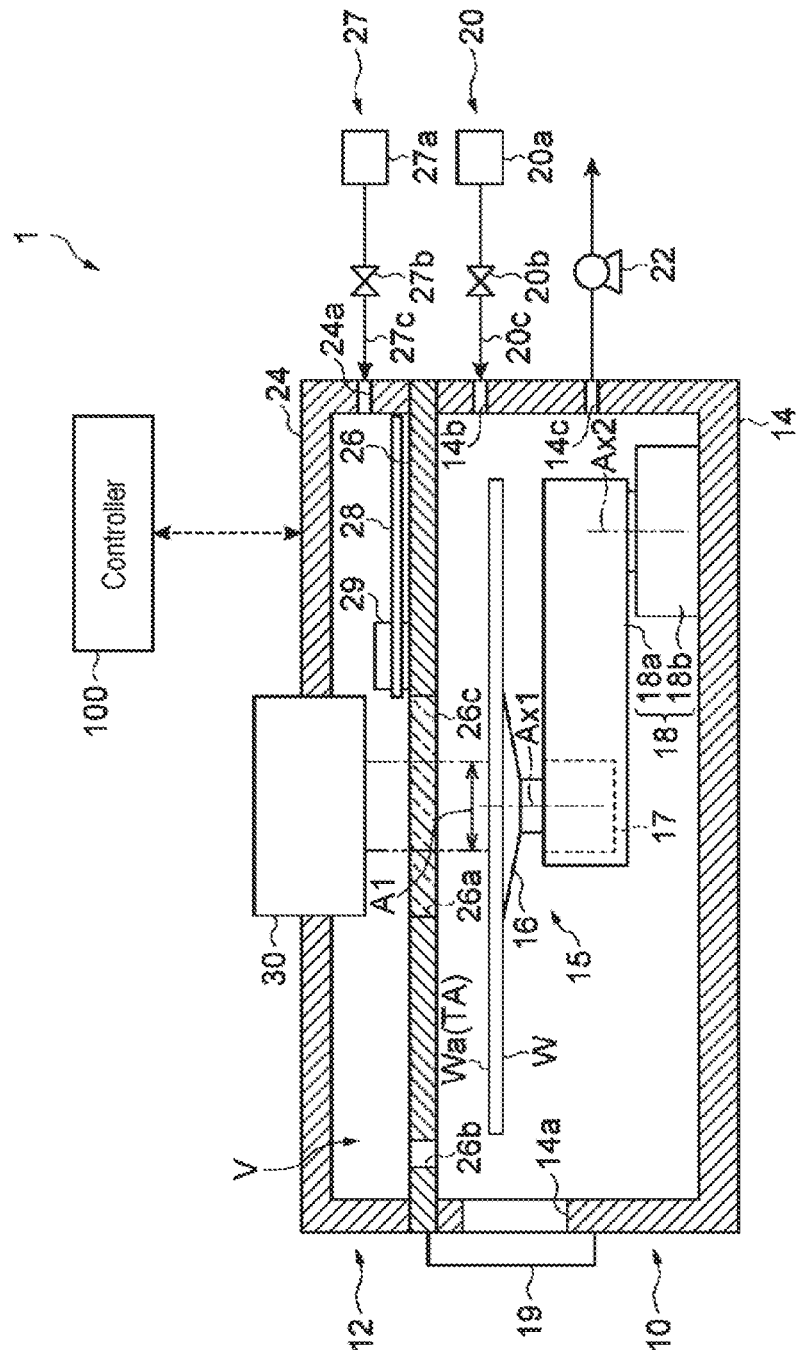
- FIG. 1 is a schematic view illustrating a configuration of a substrate processing apparatus according to an exemplary embodiment.

Reference will now be made in detail to various embodiments, examples of which are illustrated in the accompanying drawings. In the following description, the same reference numerals will be used for the same elements or elements having the same function, and redundant descriptions will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Configuration of Substrate Processing Apparatus]

An example of the substrate processing apparatus 1 will be described with reference to FIGS. 1 to 5. The substrate processing apparatus 1 radiates a light for processing to a wafer W (substrate). For example, the substrate processing apparatus 1 is configured such that a vacuum ultraviolet light (VUV light) is radiated to a resist film or a resist pattern formed on a surface of the wafer W so as to reduce a surface roughness of the resist material. The substrate processing apparatus 1 may radiate the VUV light to the resist material which has been exposed.

The wafer W may have a disk shape, or may have a plate shape other than the circular shape such as a polygonal shape. The wafer W may have a cutaway portion in which the wafer W is partially cut away. The cutaway portion may be, for example, a notch (such as a U-shaped groove, and a V-shaped groove) or a linearly extending straight portion (so-called an orientation flat). The wafer W may be, for example, a semiconductor substrate, a glass substrate, a mask substrate, a flat panel display (FPD) substrate, or other various substrates. A diameter of the wafer W may be, for example, about 200 mm to 450 mm.

As illustrated in FIG. 1, the substrate processing apparatus 1 includes a processing chamber 10, a light source chamber 12, and a controller 100 (control part).

The processing chamber 10 includes a housing 14, a driver 15, a gate 19, a gas supply part 20, and a vacuum pump exhaust part). The housing 14 is, for example, a part of a vacuum container provided in the air atmosphere, and is configured to be able to store a wafer W transported by a transport mechanism (not illustrated). The housing 14 has a cylindrical shape having an opening, which is opened to an upper portion thereof, and a bottom. Through holes 14a to 14c are formed in a wall of the housing 14.

The driver 15 operates based on an instruction of the controller 100, and moves an irradiation area of the VUV light in two directions intersecting (e.g., being orthogonal to) each other in a plane along a surface Wa of the wafer W. The driver 15 is configured to move the irradiation area independently in the two directions. In other words, the driver 15 is configured to be able to independently change the position of the irradiation area in the two directions. More specifically, without changing the position of the irradiation area in one of the two directions, the driver 15 is configured to be able to change the position of the irradiation area in the other of the two directions.

For example, the driver 15 includes a holder 16, a rotation driver 17, and a scan driver 18. The holder 16 supports a central portion of the wafer W disposed horizontally with the surface Wa facing upwards, and holds the wafer W by, for example, vacuum suction. The rotation driver 17 moves the irradiation area in one of the two directions (e.g., a first direction D1 in FIG. 2) by rotating the holder 16 holding the wafer W around a vertical axis Ax1 together with the wafer W. The rotation driver 17 is, for example, a rotation actuator that uses an electric motor as a power source.

Figure 2:
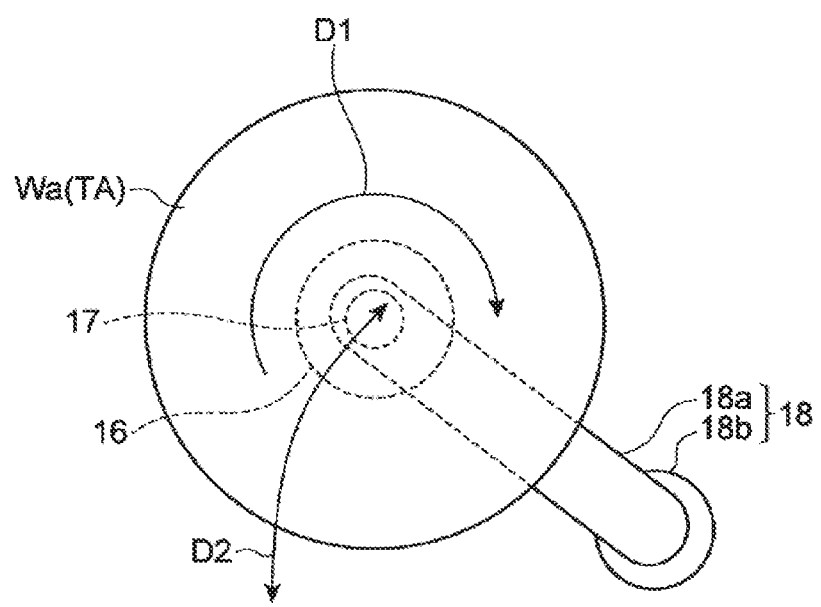
FIG. 2 is a plan view of a driver in FIG. 1.

The scan driver 18 moves the wafer W in a direction orthogonal to a rotation center axis (the axis Ax1) of the wafer W by the rotation driver 17, thereby moving the irradiation area in a direction crossing the first direction D1 (e.g., a second direction D2 in FIG. 2). For example, the scan driver 18 has an arm 18a that holds the rotation driver 17, and a swing driver 18b that swings the arm 18a around an axis Ax2 parallel to the axis Ax1. The swing driver 18b is, for example, a rotation actuator that uses an electric motor as a power source.

The gate 19 is disposed on an outer surface of a sidewall of the housing 14. The gate 19 operates based on an instruction of the controller 100, and is configured to close and open the through hole 14a of the housing 14. When the through hole 14a is opened by the gate 19, a wafer W is able to be loaded into/unloaded from the housing 14. That is, the through hole 14a also functions as an inlet/outlet port of the wafer W.

The gas supply part 20 is configured to supply an inert gas (e.g., argon or nitrogen) into the housing 14 through the through hole 14b. The gas supply part 20 has a gas source 20a, a valve 20b, and a pipe 20c. The gas source 20a stores the inert gas, and functions as an inert gas supply source. The valve 20b operates based on an operation signal from the controller 100 to open and close the pipe 20c. The pipe 20c connects the gas source 20a, the valve 20b, and the through hole 14b sequentially from the upstream side.

The vacuum pump 22 is configured to exhaust gas from the interior of the housing 14 to evacuate the interior of the housing 14.

The light source chamber 12 includes a housing 24, a partition wall 26, a shutter member 28, a shutter driver 29, a gas supply part 27, and a light radiator 30.

The housing 24 is, for example, a part of a vacuum container provided in the air atmosphere. The housing 24 has a cylindrical shape having a bottom including an opening opened to a lower portion thereof. The housing 24 is disposed such that the open end of the housing 24 faces the open end of the housing 14. A through hole 24a is provided in a wall of the housing 24.

The partition wall 26 is disposed between the housings 14 and 24, and is configured to partition the space inside the housing 14 and the space inside the housing 24. In other words, the partition wall 26 functions as a ceiling wall of the housing 14, and also functions as a bottom wall of the housing 24. That is, the housing 24 is disposed adjacent to the housing 14 in the direction perpendicular to the surface of the wafer W (hereinafter, referred to as a "vertical direction"). The space V in the housing 24 after being partitioned by the partition wall 26 is a flat space having a height in the vertical direction which is smaller than the size of the flat space in the horizontal direction.

Through holes 26a and 26b are provided in the partition wall 26. The through hole 26a are arranged to overlap the shutter member 28 in the vertical direction. The through hole 26a is closed by a window member 26c that is capable of transmitting the VUV light. The window member 26c may be, for example, glass (e.g., magnesium fluoride glass). The through hole 26b is disposed spaced apart from the through hole 24a. The through hole 26b is not closed by, for example, the window member 26c, and constitutes a flow path through which a gas is capable of flowing.

The shutter member 28 is disposed in the space V, and blocks the light travelling from the space V to the window member 26c (light emitted from the light radiator 30 described later). The shutter driver 29 operates based on an instruction of the controller 100, and is configured to move the shutter member 28 between a light-shielding position for blocking the light travelling from the space V to the window member 26c and a non-light-shielding position for not blocking the light travelling from the space V to the window member 26c. The shutter driver 29 is, for example, an actuator that uses an electric motor as a power source.

The gas supply part 27 is configured to supply an inert gas (e.g., nitrogen) into the housing 24 through the through hole 24a. The gas supply part 27 has a gas source 27a, a valve 27b, and a pipe 27c. The gas source 27a stores the inert gas, and functions as an inert gas supply source. The valve 27b operates based on an operation signal from the controller 100 to open and close the pipe 27c. The pipe 27c connects the gas source 27a, the valve 27b, and the through hole 24a sequentially from the upstream side.

The light radiator 30 radiates the VUV light into an irradiation area A1 that is smaller than a processing target area TA of the surface Wa of the wafer W (the wafer W held by the holder 16). The processing target area TA may be the entire area of the surface Wa, or may be a part of the surface Wa (e.g., an area other than the peripheral edge portion). The diameter of the irradiation area A1 is, for example, 10 mm to 70 mm, and may be 20 mm to 60 mm or 30 mm to 50 mm. For example, the light radiator 30 is provided above the window member 26c in the space V, and radiates the VUV light into the irradiation area A1 through the window member 26c.

Figure 3:
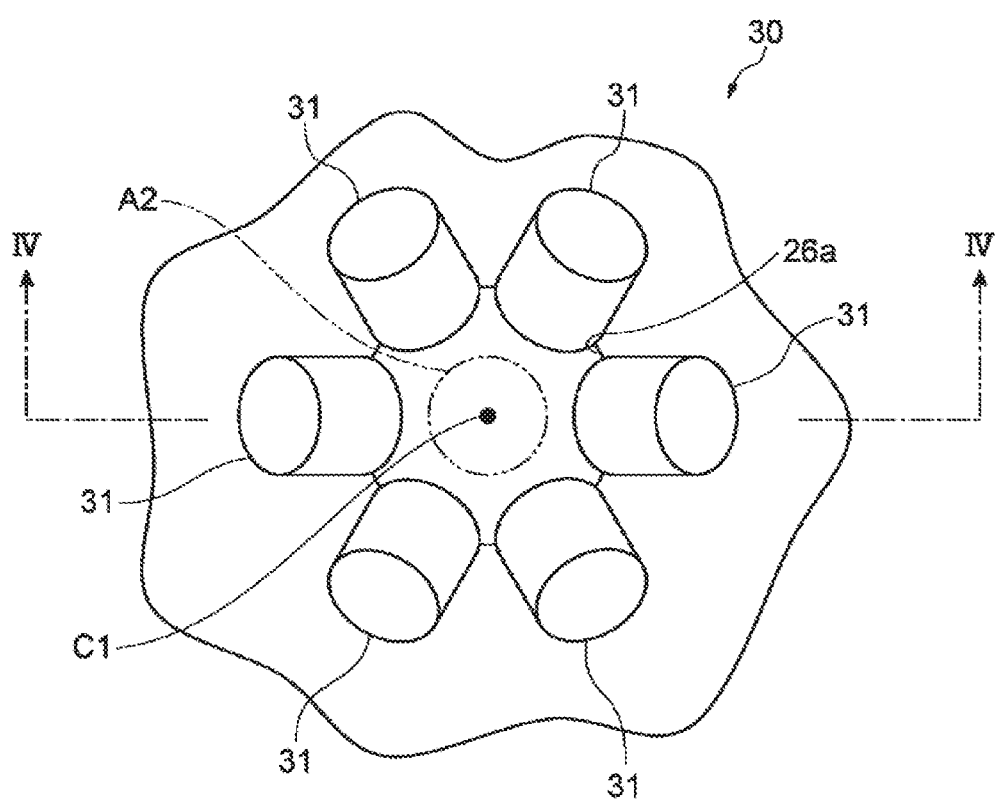
FIG. 3 is a schematic diagram exemplifying a light radiator.
Figure 4:
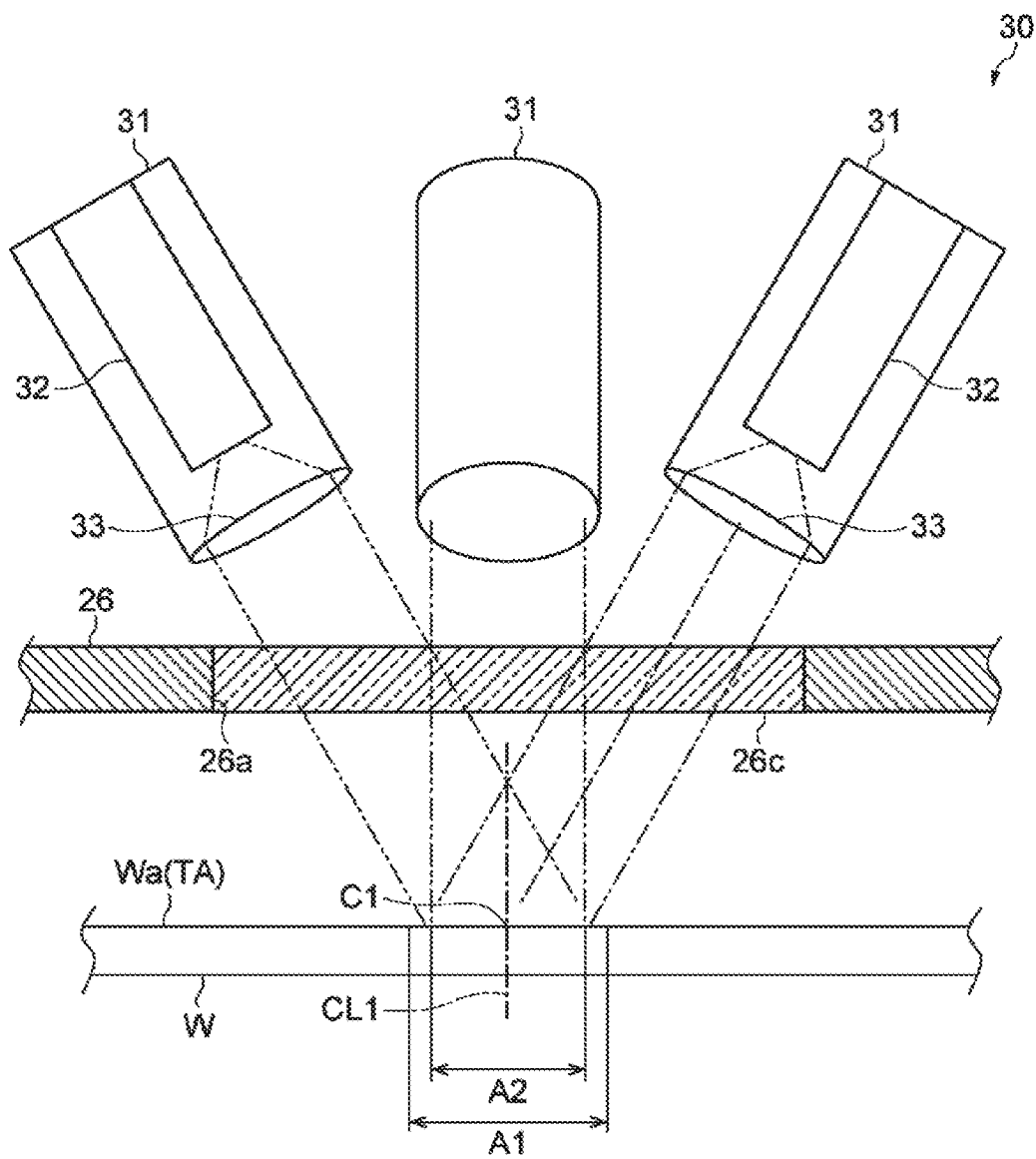
FIG. 4 is a cross-sectional view taken along line IV-IV in FIG. 3.

As illustrated in FIGS. 3 and 4, the light radiator 30 may include a plurality of light sources 31. The light sources 31 respectively radiate the light to a same condensation area A2 in the irradiation area A1. The condensation area A2 occupies most of the irradiation area A1. An area ratio of the condensation area A2 to the irradiation area A1 is, for example, 70% to 100%, and may be 80% to 100% or 90% to 100%.

Each light source 31 includes, for example, a light emission part 32 and a lens 33. The light emission part 32 generates light for radiation. The light emission part 32 is, for example, a deuterium lamp, and may be configured to emit a VUV light having a wavelength of 200 nm or less. More specifically, each light emission part 32 may be configured to emit, for example, a light having a wavelength of 115 nm to 400 nm, that is, a light having a continuous spectrum of 115 nm to 400 nm. The continuous spectrum in this range includes light having a wavelength of 10 nm to 200 nm VUV light) and near ultraviolet light (a near ultraviolet ray) having a wavelength larger than that of the VUV light. The peak wavelength of the continuous spectrum may be, for example, 160 nm or less or 150 nm or more. The lens 33 condenses the light generated by the light emission part 32 on the condensation area A2. For example, the lens 33 substantially parallelizes the light generated by the light emission part 32. In addition, the irradiation area A1 and the condensation area A2 may be further narrowed by adding the lens 33 or additional lens. By performing this condensing, it becomes easier to obtain an irradiation area having uniform illuminance distribution compared to the case in which condensing is not performed (in the case of radiating a naturally diffusing light without restricting the optical path). The light radiator 30 may further include a mirror for condensing the light emitted from the light source 31 in the condensation area A2.

The plurality of light sources 31 are disposed so as to surround an axis CL1 orthogonal to the surface Wa at the center C1 of the condensation area A2, and all the light sources 31 are inclined toward the center C1. Specifically, each light source 31 is inclined toward the center C1. For example, an inclination angle of the light sources 31 may be 15° to 45°, 20° to 40°, or 25° to 35° with reference to a posture in which the central ray of the emitted light is directed vertically downward. As described above, according to the arrangement in which the axis CL1 is surrounded by the plurality of light sources 31 inclined to the center C1, the brightness unevenness in the condensation area A2, which is caused by the inclination of the individual light sources 31 is reduced. For example, the intensity of the light reaching the condensation area A2 from the light sources 31 on the left side in FIG. 3 decreases toward the right side due to the difference in optical path length. Conversely, the intensity of the light reaching the condensation area A2 from the light sources 31 on the right side in FIG. 3 decreases toward the left side. For this reason, since the light from the light sources 31 on the left side and the light from the light sources 31 on the right side overlap each other, the brightness unevenness in the condensation area A2 is reduced.

Figure 5:
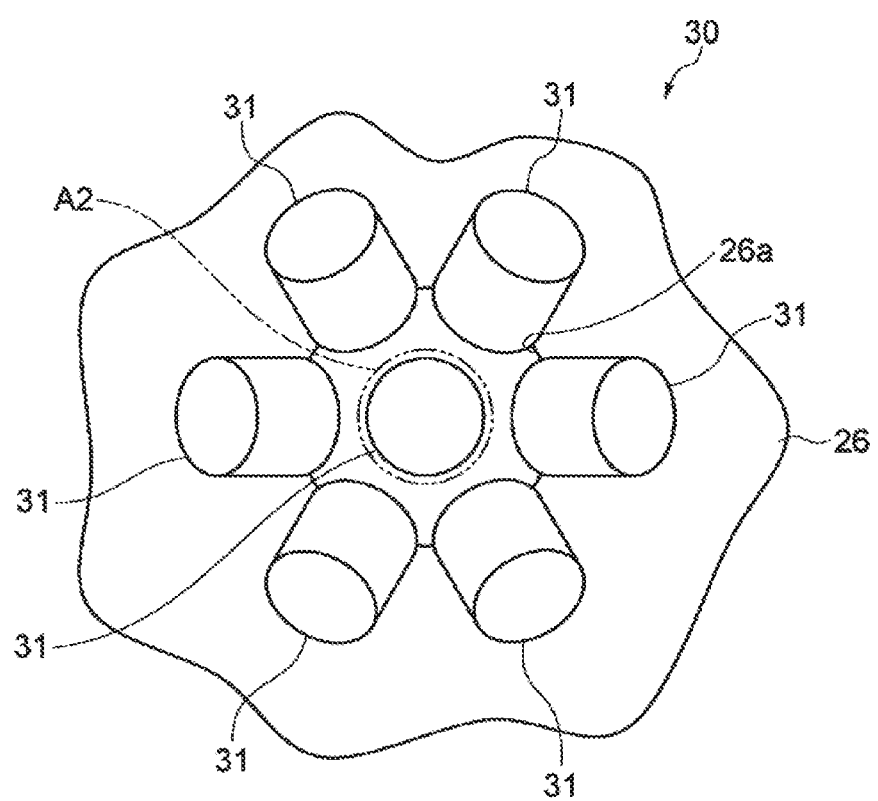
FIG. 5 is a schematic view illustrating a modification of the light radiator.

The number of light sources 31 is, for example, 4 to 7. FIGS. 3 and 4 illustrate the case in which the number of light sources 31 is six. As shown in FIG. 5, in addition to the plurality of light sources 31 surrounding the axis CL1, the light radiator 30 may further include a light source 31 directed vertically downward on the surface Wa.

Since the wavelength range of the spectrum of the light radiated from the light radiator 30 is relatively wide, the resist material on the surface Wa of the wafer W receives various light energy. As a result, various reactions occur on the surface of the resist material. Specifically, since chemical bonds at various positions in molecules constituting the resist material are broken to produce various compounds, the orientation of the molecules present in the resist material before being subjected to a light radiation is eliminated, the surface free energy of the resist material is reduced, and the internal stress of the resist material is reduced. Thereby, the surface fluidity of the resist material increases. Therefore, it is possible to improve the effect of reducing the surface roughness of the wafer W.

The light radiated to the resist material is likely to reach the deep layer of the resist material as the wavelength of the light is larger. In this respect, the peak wavelength of the spectrum of the light emitted from the light radiator 30 is included in the band of the VUV light (10 nm to 200 nm) as described above, Therefore, the intensity of the light having a relatively large wavelength among the light radiated from the light radiator 30 is small. Therefore, the light emitted from the light radiator 30 hardly reaches the deep layer of the resist material. As a result, in the deep layer of the resist material, it is possible to suppress the above-mentioned breaking of bond of molecules. That is, it is possible to limit the area reacting to light radiation to near the surface of the resist material.

Figure 6:
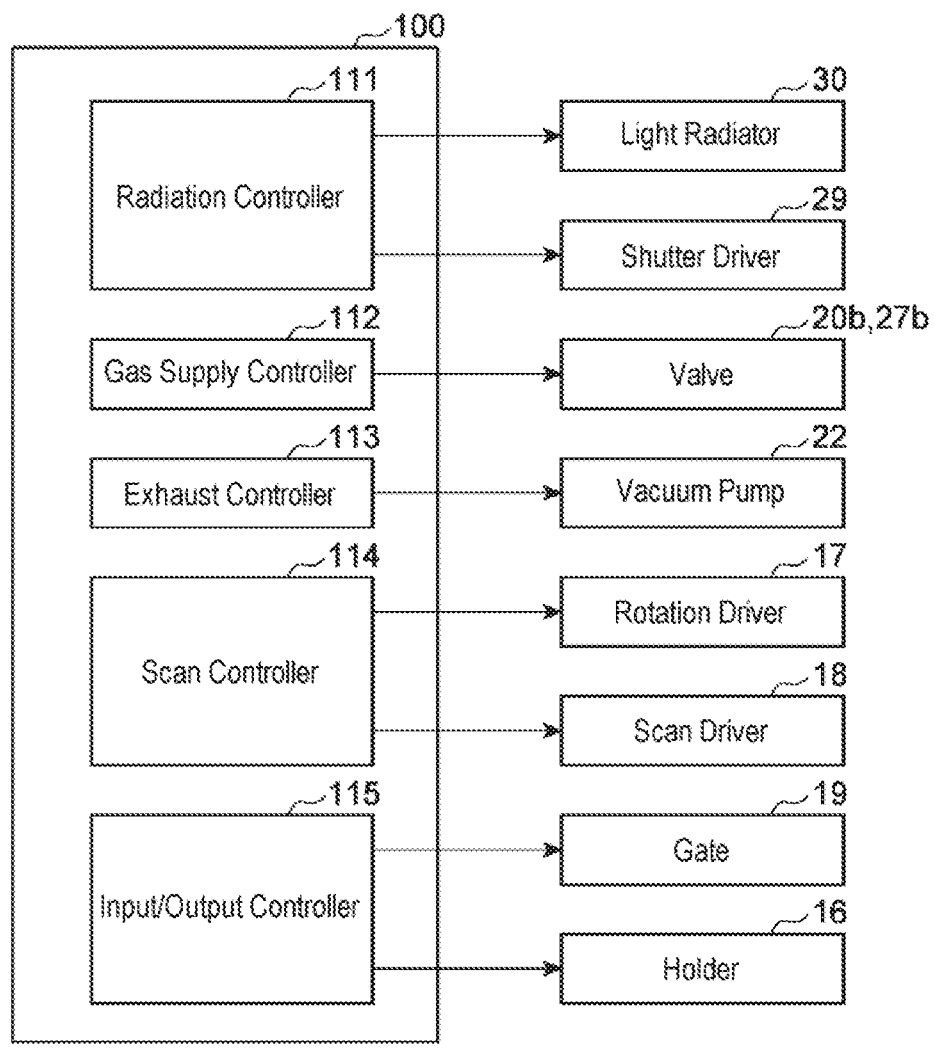
FIG. 6 is a block diagram exemplifying a functional configuration of a controller.

The controller 100 controls the driver 15 to move the irradiation area A1 in two directions depending on a movement pattern which has been set to radiate the VUV light to the entire processing target area TA. As exemplified in FIG. 6, the controller 100 has, as functional components (hereinafter referred to as "functional modules"), a radiation controller 111, a gas supply controller 112, an exhaust controller 113, and a scan controller 114, and an input/output controller 115. These functional modules are merely the functions of the controller 100 divided into a plurality of modules for the sake of convenience, and do not necessarily mean that the hardware constituting the controller 100 is divided into such modules.

The radiation controller 111 controls the light radiator 30 and the shutter driver 29 so as to radiate the VUV light to the irradiation area A1 at desired timing (hereinafter, referred to as "radiation timing"). For example, the radiation controller 111 controls the light radiator 30 to turn on all the light sources 31 prior to the radiation timing, and controls the shutter driver 29 to move the shutter member 28 to the non-light shielding position at the start of radiation timing. In addition, the radiation controller 111 controls the shutter driver 29 to move the shutter member 28 to the light-shielding position when the radiation timing is completed, and controls the light radiator 30 to turn off all the light sources 31 after the completion of the radiation timing.

The gas supply controller 112 controls the valve 20b to supply an inert gas from the through hole 14b into the processing chamber 10 (into the housing 14). In addition, the gas supply controller 112 controls the valve 27b to supply an inert gas from the through hole 24a into the light source chamber 12 (into the housing 24). The exhaust controller 113 controls the vacuum pump 22 to exhaust the gas in the processing chamber 10 (in the housing 14) to the outside through the through hole 14c.

The input/output controller 115 controls the gate 19 to open and close the through hole 14a according to loading of the wafer W into the housing 14 and unloading of the wafer W from the interior of the housing 14, and controls the driver 15 to switch between holding and releasing of the wafer W by the holder 16.

The scan controller 114 controls the driver 15 to move the irradiation area A1 in two directions according to a movement pattern which has been set to radiate the VUV light to the entire processing target area TA. The scan controller 114 may control the driver 15 to move the irradiation area A1 according to a movement pattern which has been set such that the variation of the irradiation amount of each portion in the processing target area TA (e.g., three times a standard deviation) becomes less than 5% of the average irradiation amount.

For example, the scan controller 114 may control the scan driver 18 such that the stay time of the irradiation area A1 at each position in the second direction D2 is shortened as the irradiation area A1 approaches the rotation center axis (the axis Ax1) of the wafer W.

The scan controller 114 may control the scan driver 18 to reciprocate the irradiation area A1 in a plurality of reciprocating ranges having different center positions and to increase the reciprocating speed of the irradiation area A1 as the center positions of the reciprocating ranges come closer to the axis Ax1. The scan controller 114 may control the scan driver 18 to increase the number of reciprocations of the irradiation area A1 as the center positions of the reciprocating ranges approach the axis Ax1. The scan controller 114 may control the scan driver 18 such that each of the reciprocating ranges overlaps at least one of the other reciprocating ranges. The scan controller 114 may control the scan driver 18 to increase the reciprocating stroke of the irradiation area A1 as the center positions of the reciprocating ranges approach the axis Ax1.

Figure 7:
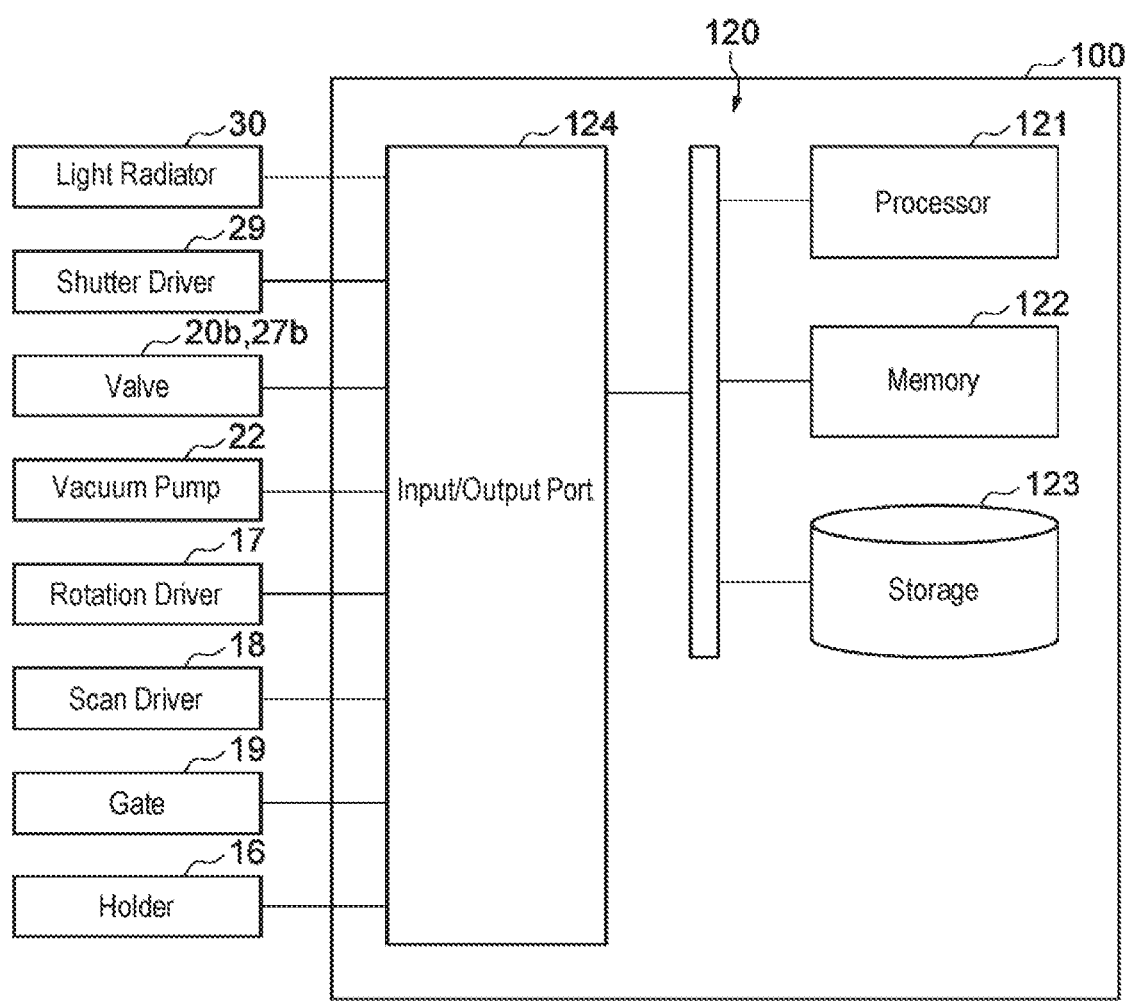
FIG. 7 is a block diagram exemplifying a hardware configuration of the controller.

The controller 100 is configured with one or more control computers. For example, the controller 100 includes a circuit 120 illustrated in FIG. 7. The circuit 120 includes one or more processors 121, a memory 122, a storage 123, and an input/output port 124. The storage 123 has a computer-readable storage medium such as a hard disk. The storage medium stores a program for causing the substrate processing apparatus 1 to execute a substrate processing procedure to be described later. The storage medium may be a removable medium such as a nonvolatile semiconductor memory, a magnetic disk, or an optical disk. The memory 122 temporarily stores a program loaded from the storage medium of the storage 123 and a result of arithmetic operation performed by the processor 121. The processor 121 constitutes each of the above-described functional modules by executing the aforementioned program in cooperation with the memory 122. The input/output port 124 performs input/output of electric signals between the processor 121 and a group consisting of the light radiator 30, the shutter driver 29, the valves 20b and 27b, the vacuum pump 22, the holder 16, the rotation driver 17, the scan driver 18, and the gate 19, according to an instruction from the processor 121.

The hardware configuration of the controller 100 is not necessarily limited to constituting each functional module by a program. For example, each functional module of the controller 100 may be constituted by a dedicated logic circuit or an application specific integrated circuit (ASIC) in which the dedicated logic circuit is integrated.

[Substrate Processing Method]

Subsequently, as an example of a substrate processing method, a substrate processing procedure executed by the substrate processing apparatus 1 will be described. This procedure includes radiating the VUV light to the irradiation area A1 and moving the irradiation area A1 in two directions crossing each other according to a movement pattern which has been set to radiate the light to the entire area of the processing target area TA.

Figure 8:
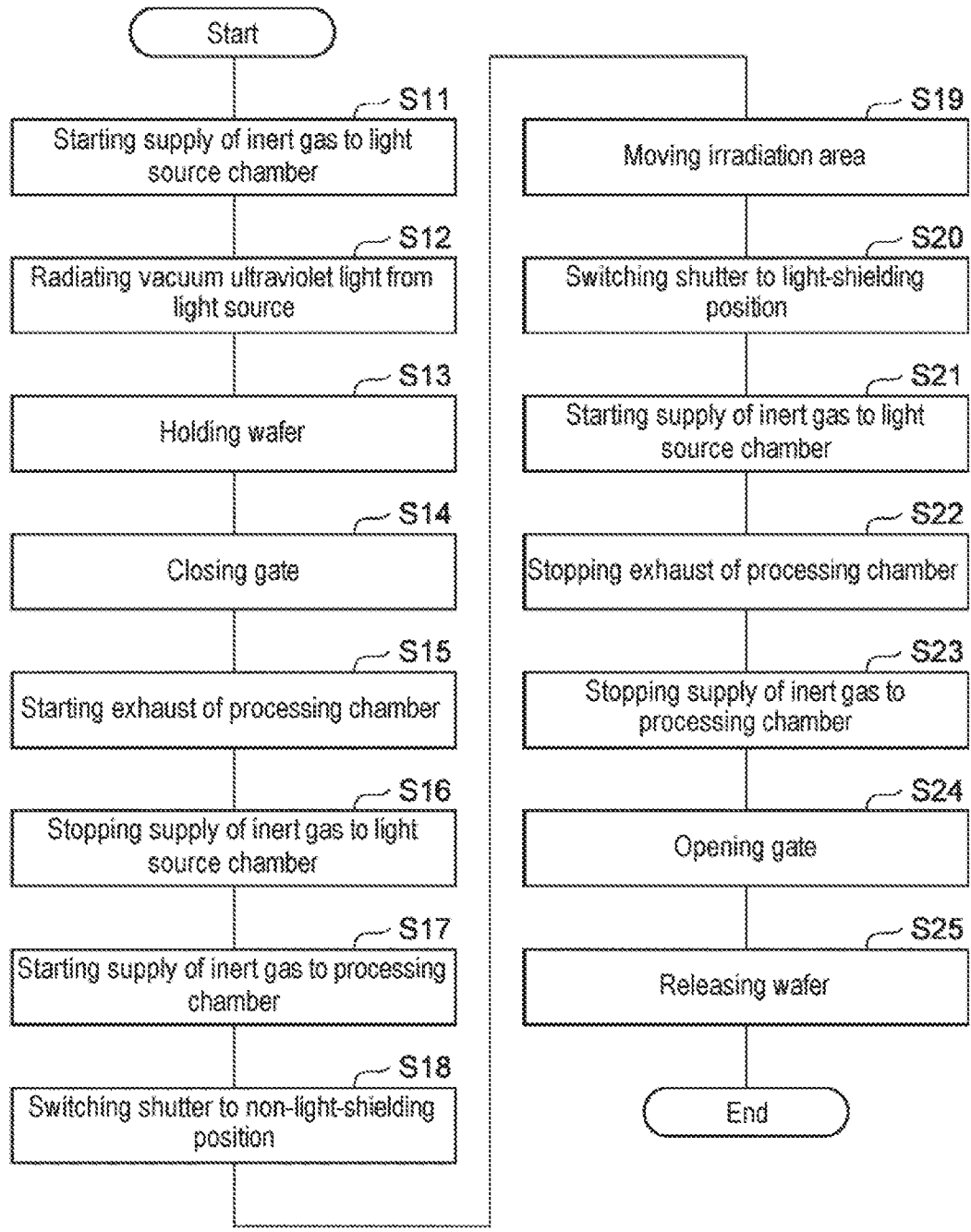
FIG. 8 is a flowchart exemplifying a substrate processing procedure.

FIG. 8 is a flowchart exemplifying this substrate processing procedure. Just before performing the substrate processing procedure of FIG. 8, a wafer W does not exist in the processing chamber 10, the gate 19 opens the through hole 14a (the processing chamber 10 is open to the air atmosphere), the shutter member 28 is in the light-shielding position, and the operations of the gas supply parts 20 and 27 and the vacuum pump 22 are stopped.

Figure 9A:
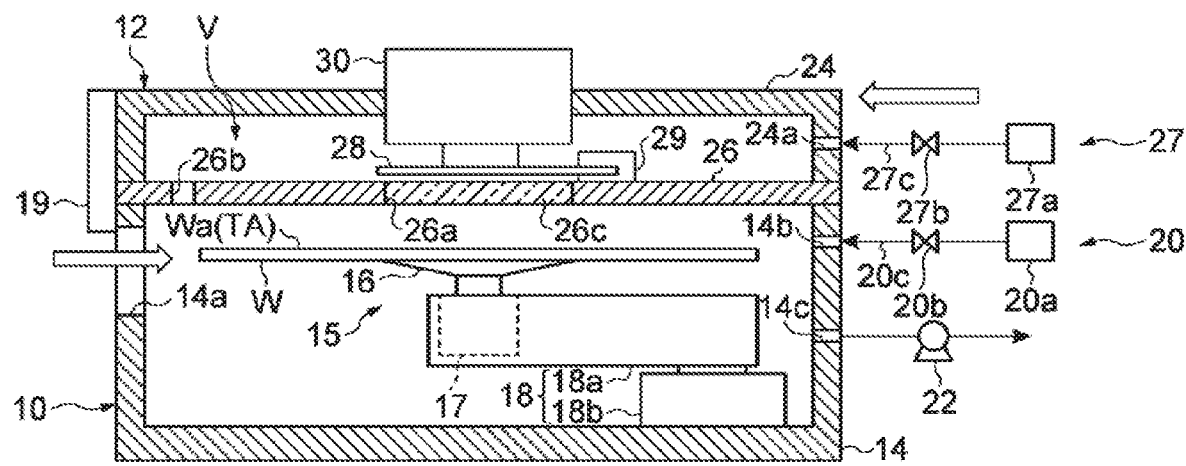
FIGS. 9A and 9B are schematic views exemplifying an operation of a substrate processing apparatus before starting radiation.

First, the controller 100 executes steps S11 and S12. In step S11, the gas supply controller 112 controls the gas supply part 27 to open the valve 27b and to start supply of the inert gas into the light source chamber 12 (into the housing 24) (see FIG. 9A). As a result, the interior of the light source chamber 12 is filled with the inert gas. The inert gas in the light source chamber 12 flows through the space V, and then flows into the processing chamber 10 through the through hole 26b. In step S12, the radiation controller 111 controls the light radiator 30 to turn on the light sources 31 and to start emission of the VUV light. At this time, the VUV light remains in the light source chamber 12 because the shutter member 28 is in the light-shielding position. Since the interior of the light source chamber 12 is filled with the inert gas, the VUV light hardly reacts with oxygen.

Figure 9B:
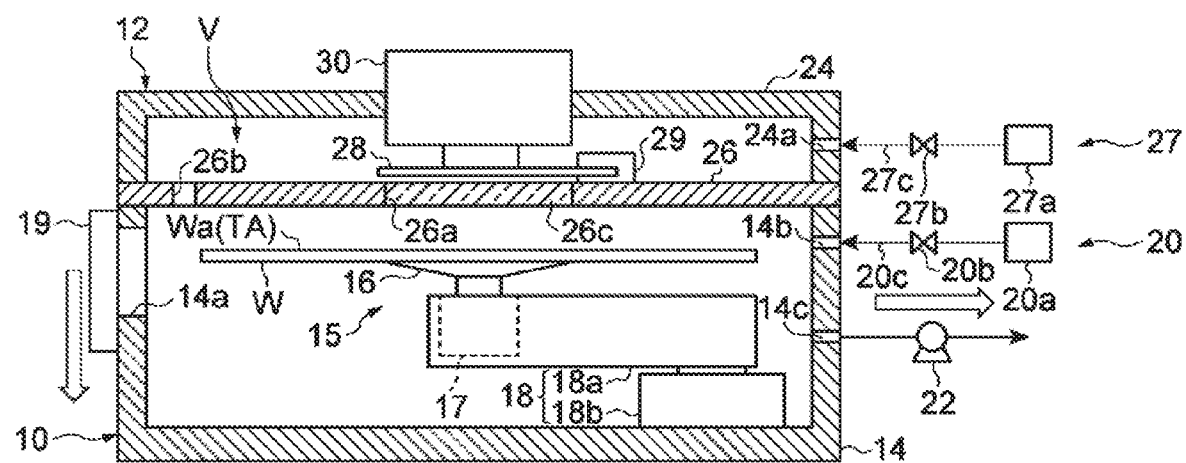

Next, the controller 100 executes steps S13 and S14. In step S13, the input/output controller 115 controls the driver 15 such that the wafer W loaded into the processing chamber 10 is supported and held by the holder 16. In the subsequent steps, the interior of the processing chamber 10 is evacuated. In order to maintain the holding state of the wafer W even after the interior of the processing chamber 10 is evacuated, the holder 16 adsorbs the wafer W at a pressure lower than the internal pressure of the processing chamber 10 after the evacuation. For example, the difference between the internal pressure of the processing chamber 10 after evacuation and the pressure at which the holder 16 adsorbs the wafer W is set to about 5 kPa. In step S14, the input/output controller 115 controls the gate 19 to close the through hole 14a (see FIG. 9B).

Figure 10A:
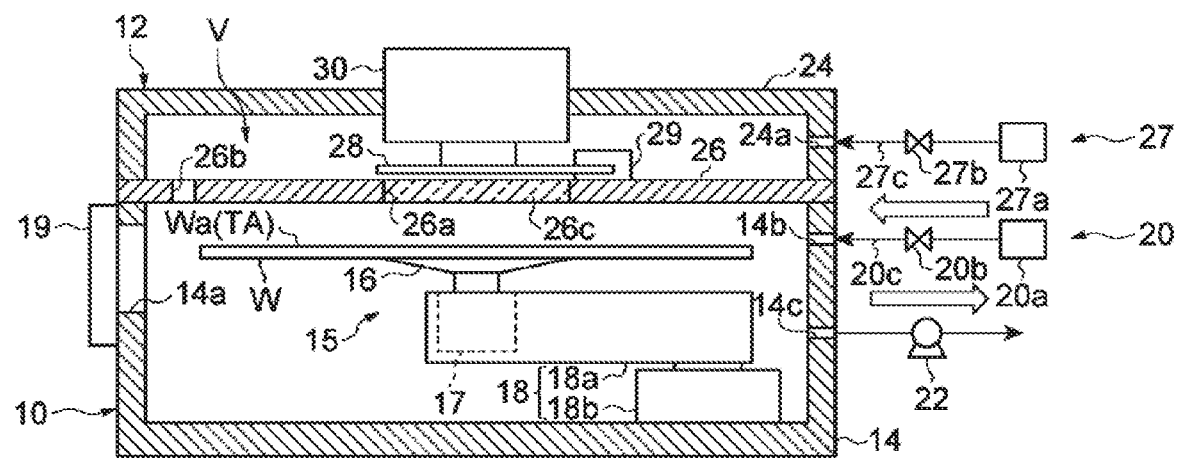
FIGS. 10A and 10B are schematic views exemplifying an operation of a substrate processing apparatus before stating radiation.

Next, the controller 100 executes steps S15, S16, and S17. In step S15, the exhaust controller 113 controls the vacuum pump 22 to start the decompression of the interior of the processing chamber 10 by exhaust (see FIG. 9B). In step S16, the gas supply controller 112 controls the gas supply part 27 to stop the supply of the inert gas into the light source chamber 12 by closing the valve 27b. In step S17, the gas supply controller 112 controls the gas supply part 20 to open the valve 20b and to start the supply of the inert gas into the processing chamber 10 (into the housing 14) (see FIG. 10A). As a result, the pressure in the processing chamber 10 is increased to a set pressure, and the oxygen concentration in the processing chamber 10 is adjusted so as to be a very low concentration. The oxygen concentration at this time may be, for example, 50 ppm or less or 20 ppm or less.

Figure 10B:
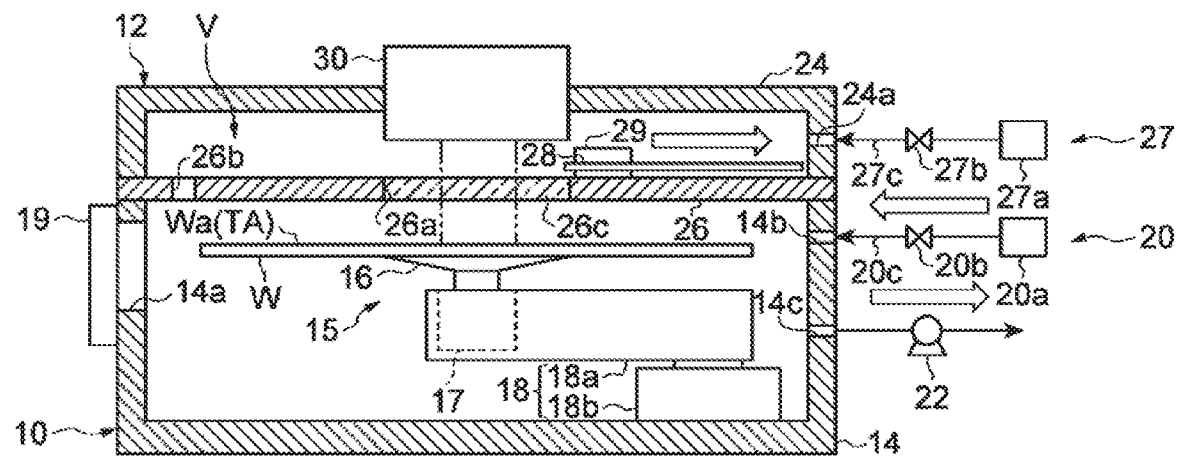

Next, the controller 100 executes step S18. In step S18, the radiation controller 111 controls the shutter driver 29 to move the shutter member 28 to the non-light-shielding position. Thus, the VUV light from the light radiator 30 is irradiated to the surface Wa of the water W through the window member 26c (see FIG. 10B).

Next, the controller 100 executes step S19. In step S19, the scan controller 114 controls the driver 15 to move the irradiation area A1 in two directions according to a movement pattern which has been set so as to radiate the VUV light to the entire processing target area TA. The movement pattern includes a rotation drive pattern of the wafer W by the rotation driver 17 and a reciprocation movement pattern of the wafer W by the scan driver 18. The scan controller 114 controls the rotation driver 17 to rotate the wafer W according to the rotation drive pattern. In addition, the scan controller 114 controls the scan driver 18 to move the wafer W according to the reciprocation movement pattern. The rotation drive pattern and the reciprocation movement pattern are set such that the variation of the irradiation amount of each portion in the processing target area TA (e.g., three times the standard deviation) is less than 5% of the average irradiation amount.

For example, the reciprocation movement pattern of the wafer W by the scan driver 18 is set such that the stay time of the irradiation area A1 at each position in the second direction D2 is shortened as the irradiation area A1 approaches the rotation center axis (the axis Ax1) of the water W. Hereinafter, this condition will be referred to as "stay time condition".

As exemplified in FIG. 11, the reciprocation movement pattern of the wafer W by the scan driver 18 is set to reciprocate the irradiation area A1 in a plurality of reciprocating ranges R1, R2, R3, and R4 having different center positions. The movement pattern of the wafer W is set to increase the speed of the reciprocating movement of the irradiation area A1 as the center positions of the reciprocating ranges R1, R2, R3, and R4 approach the axis Ax1.

The movement pattern of the wafer W may be set such that each of the reciprocating ranges R1, R2, R3, and R4 overlaps at least one of the other reciprocating ranges. The movement pattern of the wafer W may be set to increase the reciprocating stroke of the irradiation area A1 as the center positions of the reciprocating ranges R1, R2, R3, and R4 approach the axis Ax1. For example, one ends of all of the reciprocating ranges R1, R2, R3, and R4 are located outside the processing target area TA. The other end of the reciprocating range R2 is positioned closer to the axis Ax1 than the other end of the reciprocating range R1. For this reason, the center position of the reciprocating range R2 is positioned closer to the axis Ax1 than the center position of the reciprocating range R1. Similarly, the other end of the reciprocating range R3 is positioned closer to the axis Ax1 than the other end of the reciprocating range R2. For this reason, the center position of the reciprocating range R3 is positioned closer to the axis Ax1 than the center position of the reciprocating range R2. Similarly, the other end of the reciprocating range R4 is positioned closer to the axis Ax1 than the other end of the reciprocating range R3. For this reason, the center position of the reciprocating range R4 is positioned closer to the axis Ax1 than the center position of the reciprocating range R3. In addition, the reciprocating range R1 overlaps the reciprocating ranges R2, R3 and R4 in the its entire area, the reciprocating range R2 overlaps the reciprocating ranges R3 and R4 in its entire area, and the reciprocating range R3 overlaps the reciprocating range R4 in its entire area. Each of the reciprocating ranges R1, R2, R3, and R4 is set in a range of 2% to 120% of the radius of the wafer W. For example, when the radius of the wafer W is 150 mm, each of the reciprocating ranges R1, R2, R3, and R4 is set in the range of 4 mm to 180 mm. As an example, R1 is about 5 mm, and R4 is about 170 mm.

The movement pattern of the wafer W may be set to increase the number of reciprocations of the irradiation area A1 as the center positions of the reciprocating ranges R1, R2, R3, and R4 approach the axis Ax1. However, even if the number of reciprocations increases as the center positions approach the axis Ax1, the above-mentioned stay time condition needs to be satisfied. For example, in the case of the movement pattern of FIG. 11, even if the number of reciprocations in the reciprocating range R4 is increased, the stay time of both of the proximal portion and the distal portion of the axis Ax1 is increased, and thus the above stay time condition is satisfied.

Figure 12A:
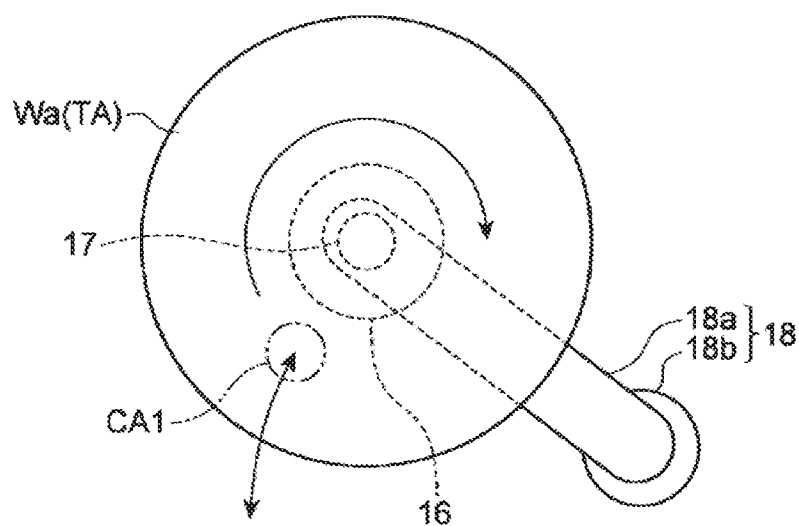
FIGS. 12A and 12B are schematic views exemplifying an operation of the scan driver during radiation.
Figure 12B:
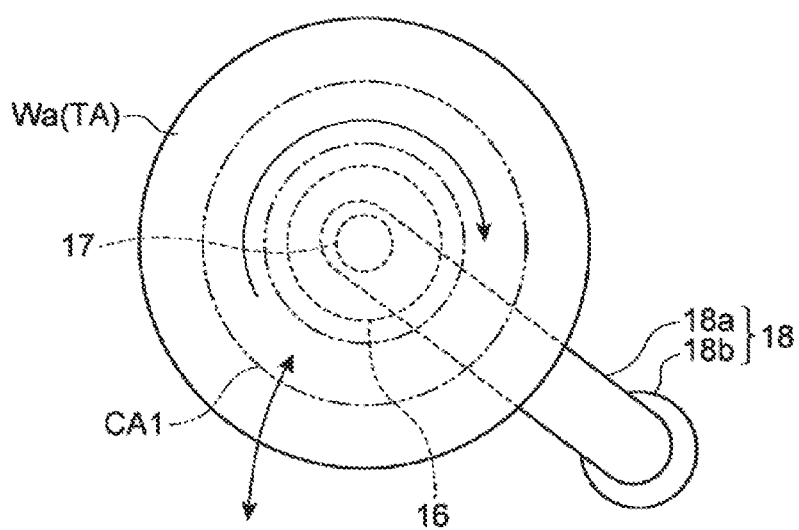

The movement pattern of the wafer W may be set such that a stop period of the irradiation area A1 when the moving direction of the irradiation area A1 is changed is equal to the time of one rotation of the wafer W. When the moving direction of the irradiation area A1 is changed, a period in which the moving speed of the irradiation area A1 is zero (hereinafter, referred to as "stop period") occurs. During the stop period, the VUV light radiation will be concentrated at the stay location of the irradiation area A1. Hereinafter, the location will be referred to as "irradiation concentration location". When the stop period is short, as illustrated in FIG. 12A, the irradiation concentration location CA1 becomes a dot shape. In contrast, when the stop period of the irradiation area A1 is set to be equal to the time of one rotation of the water W, as illustrated in FIG. 12B, the irradiation concentration location CA1 becomes an annular shape. For this reason, irradiation unevenness caused in the circumferential direction of the wafer W by the occurrence of the irradiation concentration location CA1 is suppressed. It is possible to reduce the irradiation unevenness in the radial direction of the wafer W by setting, for example, the reciprocating ranges R1, R2, R3, and R4, the reciprocating speed in each range, and the number of reciprocations in each range.

The rotation drive pattern of the wafer W by the rotation driver 17 may be set to rotate the water W at a predetermined speed, or may be set to change the rotation speed of the wafer W during the rotation. The rotation speed of the wafer W in the rotation drive pattern is set depending on the moving speed of the irradiation area A1 in the second direction D2. For example, the rotation speed of the wafer W may be set such that the number of rotations of the wafer W until the irradiation area A1 passes each position in the second direction D2 is two or more. The rotation speed may be set such that the number of rotations of the wafer W until the irradiation area A1 passes each position in the second direction D2 is three or more. The rotation speed may be set such that the number of rotations of the wafer W until the irradiation area A1 passes each position in the second direction D2 is four or more. For example, the moving speed of the irradiation area A1 in the second direction D2 is set in the range of 2 mm/sec to 50 mm/sec. As an example, the moving speed of the irradiation area A1 in the second direction D2 is set to increase as the irradiation area A1 approaches the axis Ax1, and is 44 mm/sec in a range in a vicinity of the center of the wafer W and 5 mm/sec in a range in a vicinity of an outer periphery of the wafer W. Thus, when the maximum value of the moving speed of the irradiation area A1 in the second direction D2 is 44 mm/sec, the rotation speed of the wafer W may be 150 rpm to 500 rpm, may be 200 rpm to 400 rpm, or may be 250 rpm to 350 rpm.

Figure 13:
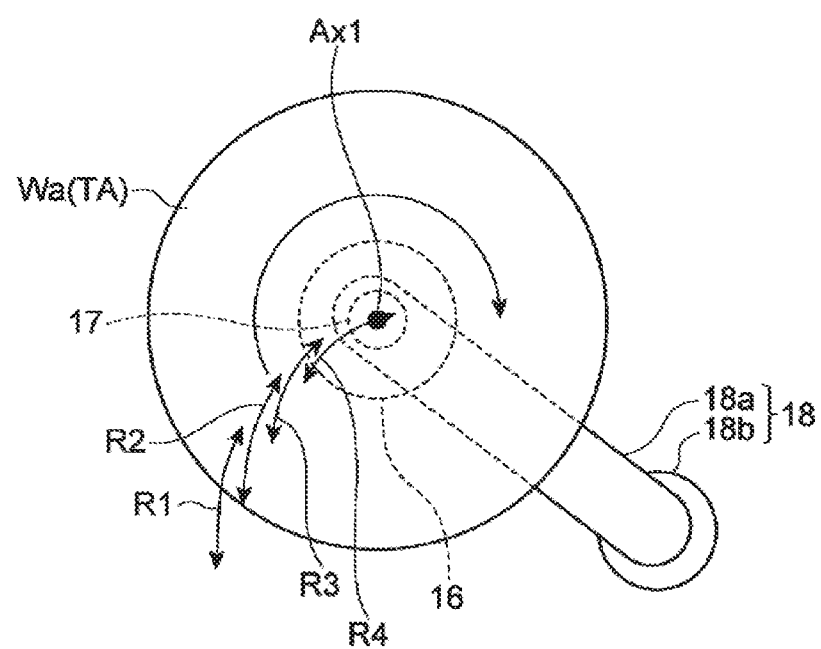
FIG. 13 is a schematic view illustrating a modification of an operation of the scan driver.

The movement pattern illustrated in FIG. 11 is merely an example. The reciprocating ranges R1, R2, R3, and R4 may be changed as appropriate as long as the stay time condition is satisfied (see FIG. 13). In addition, the scan controller 114 may control the scan driver 18 such that the movement of the wafer W in one direction continues without performing reciprocating movement while moving the center position, and the moving speed of the irradiation area A1 increases as the irradiation area A1 approaching the axis Ax1. In this case, as illustrated in FIG. 14, the moving route of the irradiation area A1 may be divided into a plurality of movement sections P1, P2, P3, P4, P11, P12, and P13, and the moving speed of the wafer W may be changed stepwise depending on which section the irradiation area A1 is located in. In addition, the moving speed of the wafer W may be changed in a stepless manner depending on the position of the irradiation area A1.

Figure 15A:
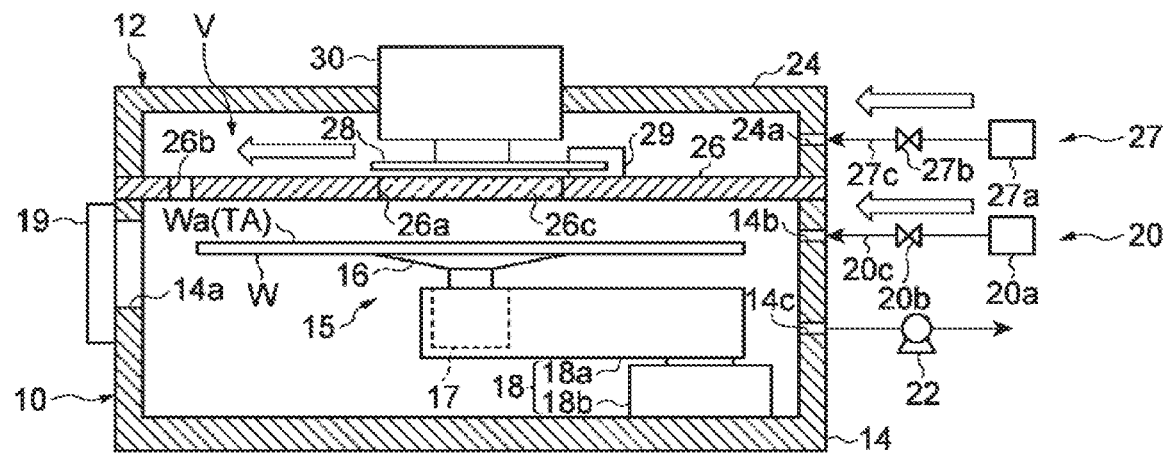
FIGS. 15A and 15B are schematic views exemplifying an operation of a substrate processing apparatus after completing radiation.

Next, the controller 100 executes step S20. In step S20, the radiation controller 111 controls the shutter driver 29 to move the shutter member 8 to the light-shielding position (see FIG. 15A). Thus, the VUV light from the light radiator 30 is blocked by the shutter member 28, and is not radiated to the interior of the processing chamber 10.

Next, the controller 100 executes steps S21 and S22. In step S21, the controller 100 controls the gas supply part 27 to open the valve 27b and to start supply of the inert gas into the light source chamber 12 (into the housing 24) (see FIG. 15A). In step S22, the exhaust controller 113 controls the vacuum pump 22 to stop the decompression of the interior of the processing chamber 10 by exhaust. At this time, since the inert gas is continuously supplied into the processing chamber 10 and the light source chamber 12, the internal pressure of the processing chamber 10 is increased.

When the pressure in the processing chamber 10 becomes equal to the atmospheric pressure, the controller 100 executes step S23. In step S23, the gas supply controller 112 controls the gas supply part 20 to stop the supply of the inert gas into the processing chamber 10 by closing the valve 20b.

Figure 15B:
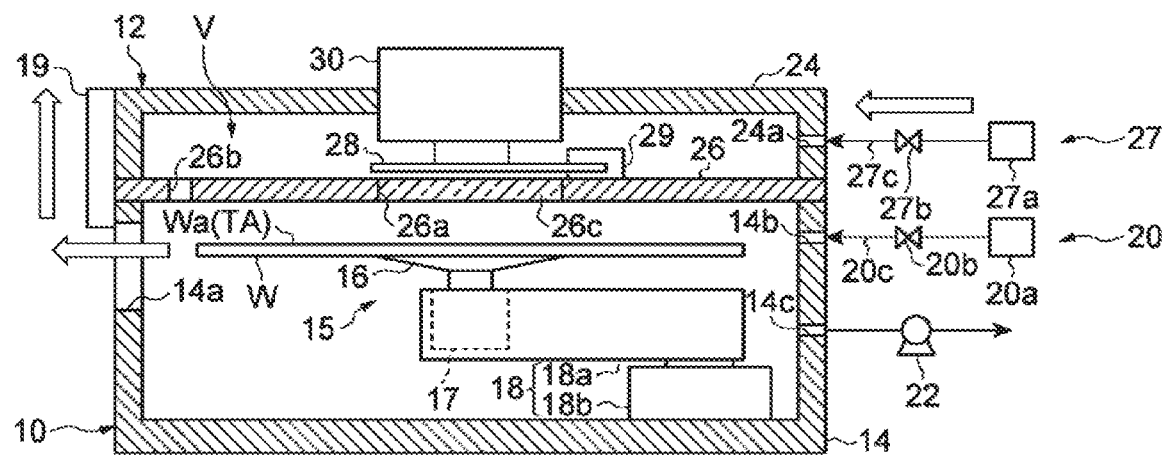

Next, the controller 100 executes steps S24 and S25. In step S14, the input/output controller 115 controls the gate 19 to open the through hole 14a (see FIG. 15B). Thus, the processing chamber 10 is opened to the air atmosphere. In step S25, prior to the unloading of the wafer W, the input/output controller 115 controls the driver 15 to release the holding of the wafer W by the holder 16 so as to release the water W. Thereafter, step S12 of FIG. 8 is omitted and the aforementioned processes in FIG. 8 are repeated while maintaining a state in which the light sources 31 are turned on. Thus, a plurality of wafers W is continuously processed.

[Action]

As described above, the substrate processing apparatus 1 includes a light radiator 30 configured to radiate the light for processing into the irradiation area A1 smaller than the processing target area TA of the surface Wa of a wafer W, and a driver 15 configured to move the irradiation area A1 in two directions crossing each other in a plane along the surface Wa of the wafer W, and a controller 100 configured to control the driver 15 to move an irradiation position in two directions according to a movement pattern which has been set to radiate the light to the entire processing target area TA.

With the substrate processing apparatus 1, the light for processing is radiated to the entire processing target area TA by moving the irradiation area A1 in the two directions crossing each other. Therefore, by adjusting the movement pattern, it is possible to freely adjust the irradiation amount of the light in each portion of the surface Wa of the wafer W. Accordingly, it is effective to improve the uniformity of the irradiation amount of the light on the surface Wa of the wafer W.

The driver 15 may include a rotation driver 17 configured to move the irradiation area A1 in a first direction D1 by rotating the wafer W, and a scan driver 18 configured to move the irradiation area A1 in a second direction D2, which crosses the first direction D1, by moving the wafer W in a direction orthogonal to the rotation center axis (the axis Ax1) of the wafer W rotated by the rotation driver 17, in this case, the movement mechanism performing movement in one of the two directions becomes a rotation mechanism, which is effective in miniaturization of the driver 15.

The controller 100 may control the scan driver 18 such that the stay time of the irradiation area A1 at each position in the second direction D2 becomes shorter as the irradiation area A1 approaches the axis Ax1. When the wafer W makes one rotation, a length of a portion on the wafer W passing through the irradiation area A1 (hereinafter, referred to as "irradiation zone") becomes shorter as the irradiation area A1 approaches the axis Ax1. For this reason, when the stay time of the irradiation area A1 at each position in the second direction D2 is uniform, the irradiation amount of light per unit area of the surface Wa of the wafer W increases as the irradiation area A1 approaches the axis Ax1. In contrast, in the above case, the scan driver 18 is controlled such that the stay time of the irradiation area A1 at each position in the second direction D2 becomes shorter as the irradiation area A1 approaches the axis Ax1. For this reason, the irradiation amount of the light per unit area is prevented from becoming larger as the irradiation area A1 approaches the axis Ax1. Accordingly, the uniformity of the irradiation amount of light is further improved.

The controller 100 may control the scan driver 18 to reciprocate the irradiation area A1 in a plurality of reciprocating ranges R1, R2, R3, and R4 having different center positions and to increase the reciprocating speed of the irradiation area A1 as the center positions of the reciprocating ranges R1, R2, R3, and R4 come closer to the axis Ax1. In this case, it is possible to easily adjust the stay time of the irradiation area A1 at each position in the second direction D2 by changing the reciprocating speed for each of the reciprocating ranges R1, R2, R3, and R4.

The controller 100 may control the scan driver 18 to increase the number of reciprocations of the irradiation area A1 as the center positions of the reciprocating ranges R1, R2, R3, and R4 approach the axis Ax1. In this case, it is possible to more finely adjust the stay time of the irradiation area A1 at each position in the second direction D2.

The controller 100 may control the scan driver 18 such that each of the reciprocating ranges R1, R2, R3, and R4 overlaps at least one of the other reciprocating ranges R1, R2, R3, and R4. In this case, it is possible to more finely adjust the stay time of the irradiation area A1 at each position in the second direction D2 using overlapping between the reciprocating ranges R1, R2, R3, and R4.

The controller 100 may control the scan driver 18 to increase the reciprocating stroke of the irradiation area A1 as the center positions of the reciprocating ranges R1, R2, R3, and R4 approach the axis Ax1. In this case, it is possible to more finely adjust the stay time of the irradiation area A1 at each position in the second direction D2.

The controller 100 may control the scan driver 18 to increase the moving speed of the A1 as the irradiation area A1 approach the axis Ax1. In this case, it is possible to easily adjust the stay time of the irradiation area A1 at each position in the second direction D2 more finely.

The controller 100 may control the driver 15 so as to perform the change of the moving direction of the irradiation area A1 outside the processing target area TA. In this case, it is possible to suppress unevenness of the irradiation amount of the light caused by the deceleration of the movement of the irradiation area A1 accompanying the change of the moving direction.

The light radiator 30 may include a plurality of light sources 31 configured to radiate the light to the same condensation area A2, which occupies most of the inside of the irradiation area A1. In this case, since the irradiation amount of light in the irradiation area A1 is large, throughput is improved.

The plurality of light sources 31 are disposed so as to surround an axis perpendicular to the surface Wa of the wafer W at the center of the condensation area A2, and all of the light sources 31 may be inclined toward the center of the condensation area A2. In this case, the uniformity of the irradiation amount of the light on the condensation area A2 is improved.

Figure 16:
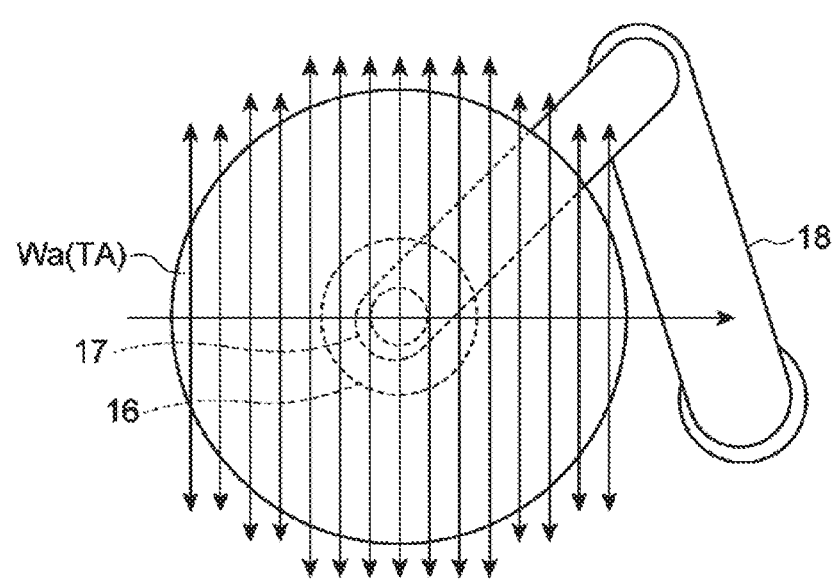
FIG. 16 is a schematic view illustrating a modification of a substrate processing apparatus.

Although the embodiment has been described above, the present disclosure is not necessarily limited to the above-described embodiment, and various modifications can be made without departing from the scope of the present disclosure. It is possible to change the driver 15 in any way as long as the irradiation area A1 can be moved in two directions crossing each other in a plane along the surface Wa. For example, the scan driver 18 may be configured to move the wafer W linearly using a linear actuator. The scan driver 18 may be configured to move the wafer W independently in two directions crossing each other. A specific example of such a configuration may be a configuration provided with a scalar-type articulated arm, as illustrated in FIG. 16. In this case, by moving the wafer W by the scan driver 18, it is possible to radiate the VUV light to the entire area of the processing target area TA. Therefore, it is possible to omit the rotation driver 17. The scan controller 114 may control the scan driver 18 to move the irradiation area A1 in the direction intersecting the reciprocating direction while reciprocating the irradiation area A1 as indicated by arrows in FIG. 16. In addition, the scan controller 114 may control the scan driver 18 so as to perform the change of the moving direction of the irradiation area A1 outside the processing target area TA. The driver 15 may move the irradiation area A1 by moving the light radiator 30 instead of moving the wafer W.

According to the present disclosure, it is possible to provide a substrate processing apparatus that is effective in improving the uniformity of the irradiation amount of the light on the surface of a substrate in substrate processing in which the surface of the substrate is irradiated with the light for processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a light radiator configured to radiate a light for processing into an irradiation area which is smaller than a processing target area of a surface of a substrate;
    a driver configured to move the irradiation area in two directions that cross each other in a plane along the surface of the substrate; and
    a controller configured to control the driver to move an irradiation position in two directions according to a movement pattern which has been set to radiate the light to an entire area of the processing target area,
    wherein the driver includes a rotation driver configured to move the irradiation area in a first direction by rotating the substrate, and a scan driver configured to move the irradiation area in a second direction that crosses the first direction by moving the substrate in a direction orthogonal to a rotation center axis of the substrate that is rotated by the rotation driver, and
    wherein the controller is configured to control the scan driver to increase a moving speed of the irradiation area as the irradiation area approaches the rotation center axis.

2. The substrate processing apparatus of claim 1, wherein the controller is configured to control the scan driver such that a stay time of the irradiation area at each position in the second direction is shortened as the irradiation area approaches the rotation center axis.

3. The substrate processing apparatus of claim 2, wherein the controller is configured to control the scan driver to reciprocate the irradiation area in reciprocating ranges having different center positions, and to increase a reciprocating speed of the irradiation area as the center positions of the reciprocating ranges approach the rotation center axis.

4. The substrate processing apparatus of claim 3, wherein the controller is configured to control the scan driver to increase a number of reciprocations of the irradiation area as the center positions of the reciprocating ranges approach the rotation center axis.

5. The substrate processing apparatus of claim 3, wherein the controller controls the scan driver such that each of the reciprocating ranges overlaps at least one of other reciprocating ranges.

6. The substrate processing apparatus of claim 5, wherein the controller is configured to control the scan driver to increase a reciprocating stroke of the irradiation area as the center positions of the reciprocating ranges approach the rotation center axis.

7. The substrate processing apparatus of claim 1, wherein the controller controls the driver to perform a change of a moving direction of the irradiation area outside the processing target area.

8. The substrate processing apparatus of claim 1, wherein the light radiator includes light sources, each of the light sources being configured to radiate the light to the same condensation area in the irradiation area, and
    wherein the same condensation area occupies most of the irradiation area.

9. The substrate processing apparatus of claim 8, wherein the light sources are disposed to surround an axis orthogonal to the surface of the substrate at a center of the condensation area, and are all inclined towards the center of the condensation area.

10. A substrate processing method comprising:
    radiating a light for processing into an irradiation area which is smaller ian a processing target area of a surface of a substrate; and
    moving an irradiation position in two directions that cross each other according to a movement pattern which has been set to radiate the light to an entire area of the processing target area,
    wherein moving the irradiation position in two directions includes:
        mowing the irradiation area in a first direction by rotating the substrate; and
        moving the irradiation area in a second direction that crosses the first direction by moving the substrate in a direction orthogonal to a rotation center axis of the substrate that is rotated, and wherein a moving speed of the irradiation area increases as the irradiation area approaches the rotation center axis.

11. A non-transitory computer-readable storage medium storing a program that causes an apparatus to execute the substrate processing method of claim 10.

* * * * *